United States Patent
Garg et al.

(10) Patent No.: US 8,576,612 B2
(45) Date of Patent: *Nov. 5, 2013

(54) LOW LEAKAGE HIGH PERFORMANCE STATIC RANDOM ACCESS MEMORY CELL USING DUAL-TECHNOLOGY TRANSISTORS

(75) Inventors: Manish Garg, Morrisville, NC (US); Chiaming Chai, Chapel Hill, NC (US); Michael ThaiThanh Phan, Cary, NC (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/102,961

(22) Filed: May 6, 2011

(65) Prior Publication Data
US 2011/0211386 A1    Sep. 1, 2011

Related U.S. Application Data

(63) Continuation of application No. 12/357,938, filed on Jan. 22, 2009, now Pat. No. 7,961,499.

(51) Int. Cl.
*G11C 11/00* (2006.01)

(52) U.S. Cl.
USPC . 365/154; 365/156; 365/189.16; 365/189.15; 365/188; 365/202; 365/233.16; 365/233.17

(58) Field of Classification Search
USPC ............... 365/154, 156, 189.16, 189.15, 188, 365/202, 233.16, 233.17
See application file for complete search history.

(56) References Cited

U.S. PATENT DOCUMENTS

| 6,373,760 | B1 | 4/2002 | Ohbayashi |
| 7,106,620 | B2 | 9/2006 | Chang et al. |
| 7,251,175 | B2* | 7/2007 | Slamowitz et al. ........... 365/207 |
| 7,961,499 | B2* | 6/2011 | Garg et al. .................... 365/154 |
| 2003/0185044 | A1 | 10/2003 | Nii |
| 2007/0139072 | A1 | 6/2007 | Yamaoka et al. |
| 2008/0068901 | A1 | 3/2008 | Ehrenreich et al. |
| 2008/0073722 | A1* | 3/2008 | Liston .......................... 257/368 |
| 2008/0151653 | A1 | 6/2008 | Ishikura et al. |
| 2008/0310207 | A1* | 12/2008 | Tan et al. ........................ 365/51 |

(Continued)

FOREIGN PATENT DOCUMENTS

| CN | 101149965 A | 3/2008 |
| JP | 2002176111 A | 6/2002 |

(Continued)

OTHER PUBLICATIONS

Written Opinion—PCT/US2010/1021652,International Search Authority—European Patent Office Apr. 14, 2010.

(Continued)

*Primary Examiner* — Fernando Hidalgo
(74) *Attorney, Agent, or Firm* — Peter Michael Kamarchik; Nicholas J. Pauley; Joseph Agusta

(57) ABSTRACT

A memory cell includes a storage element, a write circuit coupled to the storage element and a read circuit coupled to the storage element. At least a portion of the storage element and at least a portion of the write circuit are fabricated using a thicker functional gate oxide and at least a portion of the read circuit is fabricated using a thinner functional gate oxide.

21 Claims, 4 Drawing Sheets

(56) References Cited

U.S. PATENT DOCUMENTS

| | | | |
|---|---|---|---|
| 2009/0303826 A1* | 12/2009 | Perisetty | 365/230.06 |
| 2010/0054051 A1* | 3/2010 | De La Cruz et al. | 365/189.11 |
| 2010/0091585 A1* | 4/2010 | Wang | 365/189.011 |
| 2010/0182823 A1 | 7/2010 | Garg et al. | |

FOREIGN PATENT DOCUMENTS

| | | | |
|---|---|---|---|
| JP | 2003297953 A | 10/2003 | |
| JP | 2007173385 A | 7/2007 | |
| JP | 2008176910 A | 7/2008 | |
| JP | 2008269751 A | 11/2008 | |
| KR | 20020096410 | 12/2002 | |

OTHER PUBLICATIONS

Suzuki T et al: "A Stable 2-Port SRAM Cell Design Against Simultaneously ReadIWrite-Disturbed Accesses" IEEE Journal of Solid-State Circuits, IEEE Service Center, Piscataway, NJ, US, vol. 43, No. 9,Sep. 1, 2008, pp. 2109-2121 19, XP011234620, ISSN: 0018-9200, figures 4(c),5(b),14(b),l6(c).

Verma N et al: "A 256 kb 65nm 8T subthreshold SRAM employing sense-amplifier redundancy" IEEE Journal of Solid-State Circuits IEEE USA, vol. 43, No. 1, Jan. 1, 2008, pp. 141-149, XP002574376 ISSN: 0018-9200, figure 5.

International Search Report—PCT/US2010/021652, International Search Authority—European Patent Office Apr. 14, 2010.

* cited by examiner

LOW LEAKAGE HIGH PERFORMANCE STATIC RANDOM ACCESS MEMORY CELL USING DUAL-TECHNOLOGY TRANSISTORS

CLAIM OF PRIORITY UNDER 35 U.S.C. 120

This application is a continuation of prior application Ser. No. 12/357,938 entitled "LOW LEAKAGE HIGH PERFORMANCE STATIC RANDOM ACCESS MEMORY CELL USING DUAL-TECHNOLOGY TRANSISTORS," filed 22 Jan. 2009, assigned to the assignee hereof and expressly incorporated by reference herein.

FIELD OF DISCLOSURE

This disclosure relates generally to Static Random Access Memory (SRAM) cell designs and specifically to a design that uses dual-technology transistors to achieve improved performance and power characteristics.

BACKGROUND

Static Random Access Memory (SRAM) cells are the basic building blocks of many memories. An exemplary conventional 6-transistor (6T) SRAM cell as illustrated in FIG. 1 comprises two cross-coupled inverters, each inverter comprising a serially-connected P-channel Field Effect Transistor (PFET) and N-channel Field Effect Transistor (NFET), which allows the 6T SRAM cell to store one bit of data. The 6T SRAM cell also comprises two NFET pass-gate transistors which allow reading data from and writing data into the 6T SRAM cell. A conventional memory circuit may incorporate multiple individual 6T SRAM cells.

Memories using 6T SRAM cells are commonly used as cache memories in microprocessors, digital signal processors (DSPs) and other integrated circuits. As semiconductor processes scale to smaller and smaller minimum feature sizes, the performance of the 6T SRAM cell does not always improve as much as the performance of the integrated circuits that rely on memories that employ the 6T SRAM cell. It is therefore desirable to increase performance of the SRAM cells. One conventional technique used to increase performance is to replace the 6T SRAM cell with an 8-transistor (8T) SRAM cell as illustrated in FIG. 2. The 8T SRAM cell illustrated in FIG. 2 provides separate read and write paths for the bit of data stored in the 8T SRAM cell. The 8T SRAM cell increases performance at the cost of increased leakage power due to the two additional transistors.

It is also desirable to reduce leakage power in order to reduce the overall energy usage of an integrated circuit. Since cache memories commonly can represent a significant portion of an entire integrated circuit and SRAM cells can represent a large portion of a cache memory, it is especially desirable to be able to reduce leakage power of the SRAM cells and consequently of the integrated circuit as a whole.

It is therefore desirable to develop techniques that increase performance and reduce leakage in SRAM cells.

SUMMARY OF THE DISCLOSURE

In a first embodiment of the invention, a memory cell comprises a storage element, a write circuit coupled to the storage element and a read circuit coupled to the storage element. At least a portion of the storage element and at least a portion of the write circuit are fabricated using a thicker functional gate oxide and at least a portion of the read circuit is fabricated using a thinner functional gate oxide.

In a second embodiment of the invention, a memory cell comprises first and second NFETs and first and second PFETs. The source terminals of the first and second NFETs are coupled to a ground potential and the source terminals of the first and second PFETs are coupled to a first potential. The gate terminal of the first NFET is coupled to the gate terminal of the first PFET and the gate terminal of the second NFET is coupled to the gate terminal of the second PFET. The drain terminal of the first NFET is coupled to the drain terminal of the first PFET and the drain terminal of the second NFET is coupled to the drain terminal of the second PFET. The gate terminals of the first NFET and first PFET are coupled to the drain terminals of the second NFET and second PFET and the gate terminals of the second NFET and second PFET are coupled to the drain terminals of the first NFET and the first PFET. The memory cell further includes third and fourth NFETs. The gate terminals of the third and fourth NFETs are coupled together and are adapted to be coupled to a write word line. The source terminals of the third and fourth NFETs each are adapted to be coupled to one of a pair of complementary write bit lines. The drain terminal of the third NFET is coupled to the gate terminals of the first NFET and first PFET, and the drain terminal of the fourth NFET is coupled to the gate terminals of the second NFET and second PFET. The memory cell further includes fifth and sixth NFETs. The source terminal of the fifth NFET is coupled to a ground potential. The gate terminal of the fifth NFET is coupled to the drain terminals of the first NFET and first PFET. The drain terminal of the fifth NFET is coupled to the source terminal of the sixth NFET. The gate terminal of the sixth NFET is adapted to be coupled to a read word line. The drain terminal of the sixth NFET is adapted to be coupled to a read bit line.

In a third embodiment of the invention, a memory array comprises a plurality of memory cells. At least one of the plurality of memory cells includes a storage element, a write circuit coupled to the storage element and a read circuit coupled to the storage element. At least a portion of the storage element and at least a portion of the write circuit are fabricated using a thicker functional gate oxide and at least a portion of the read circuit is fabricated using a thinner functional gate oxide.

One advantage provided by embodiments of the teachings herein is increased memory performance due to the use of higher performance transistors in the read path of a memory cell. Another advantage is reduced leakage power of the memory cell due to the use of lower leakage transistors in portions of the memory cell where higher performance is not as beneficial.

It is understood that other embodiments of the teachings herein will become apparent to those skilled in the art from the following detailed description, wherein various embodiments of the teachings are illustrated. As will be realized, the teachings herein are capable of other and different embodiments without departing from the spirit and scope of the teachings. Accordingly, the drawings and detailed description are to be regarded as illustrative in nature and not as limiting.

BRIEF DESCRIPTION OF THE DRAWINGS

Various aspects of the teachings of the present disclosure are illustrated by way of example, and not by way of limitation, in the accompanying drawings, wherein.

DETAILED DESCRIPTION

The detailed description set forth below, in connection with the appended drawings, is intended as a description of various exemplary embodiments of the teachings of the present disclosure and is not intended to represent the only embodiments in which such teachings may be practiced. The detailed description includes specific details for the purpose of providing a thorough understanding of the teachings by way of illustration and not limitation. It will be apparent to those skilled in the art that the teachings of the present disclosure may be practiced in a variety of ways. In some instances, well known structures and components are shown in block diagram form in order to avoid obscuring the concepts of the present disclosure.

Figure 1:
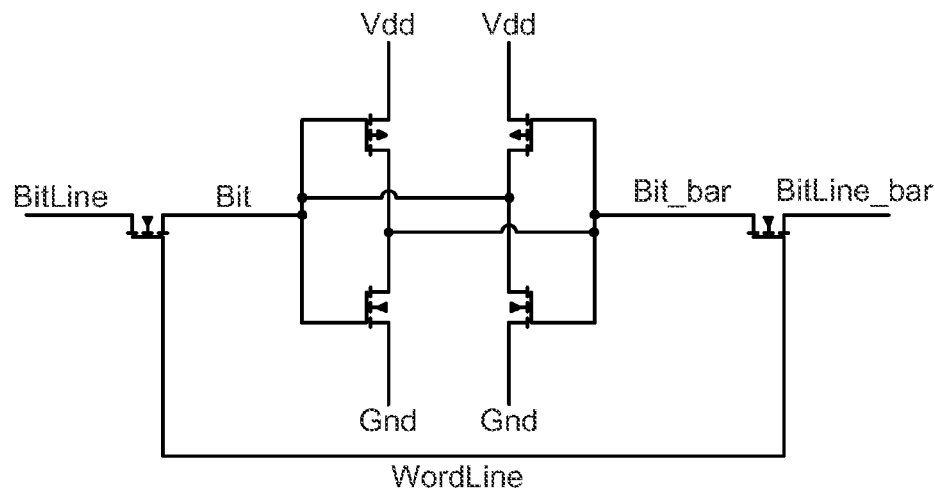
FIG. 1 is a schematic diagram of a conventional 6T SRAM cell.
Figure 2:
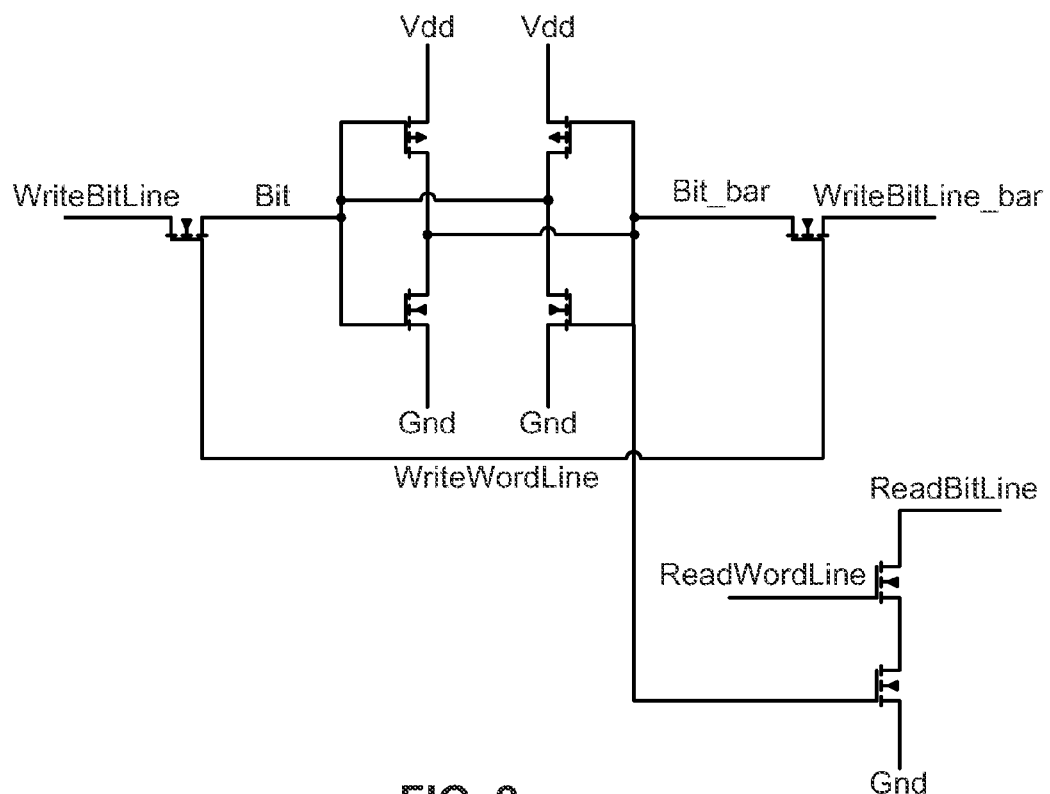
FIG. 2 is a schematic diagram of a conventional 8T SRAM cell.
Figure 3:
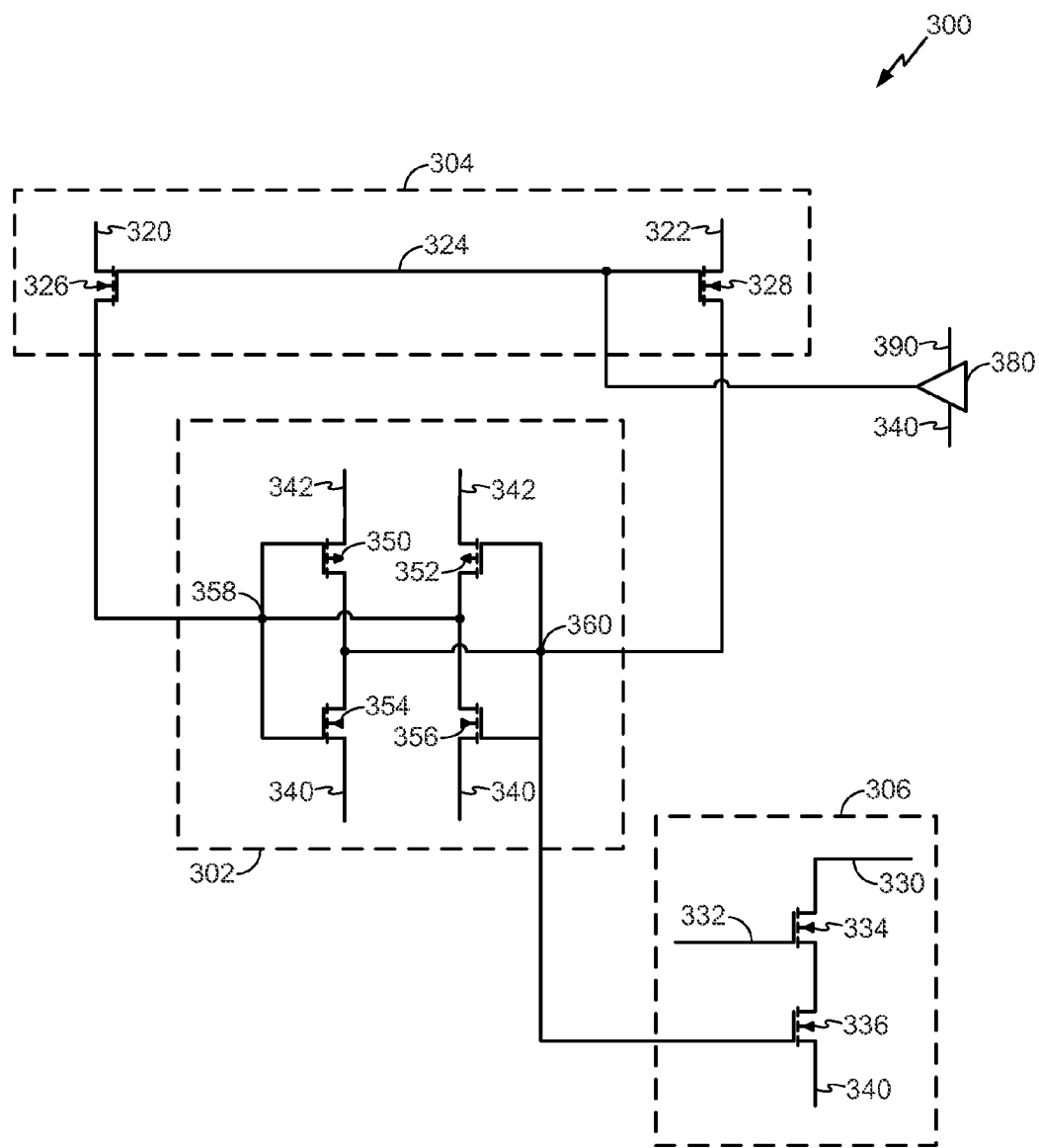
FIG. 3 is a schematic diagram of an 8T SRAM cell according to the teachings of the present disclosure.

FIG. 3 is a schematic diagram of an 8-Transistor Static Random Access Memory (8T SRAM) cell 300 according to the teachings of the present disclosure. The 8T SRAM cell 300 includes a storage element 302, a write circuit 304 and a read circuit 306. Although the 8T SRAM cell 300 illustrated in FIG. 3 has a single storage element 302, write circuit 304 and read circuit 306, those skilled in the art will recognize that other configurations employing multiple storage elements, write circuits and read circuits may advantageously employ the teachings of the present disclosure.

In one embodiment, a triple gate oxide (TGO) manufacturing process is used in the fabrication of the 8T SRAM cell 300. The TGO manufacturing process provides three transistor gate oxide thicknesses with varying performance characteristics on a monolithic integrated circuit die. An I/O gate oxide, which is commonly the thickest gate oxide available on a given integrated circuit die, is used for transistors in circuits for input to and output from the integrated circuit die (I/O devices). Two functional gate oxides, which are both commonly thinner than the I/O gate oxide, are commonly used for the remainder of the devices on the integrated circuit die (functional devices). The thicker functional gate oxide provides lower leakage at the cost of reduced performance. The thinner functional gate oxide provides increased performance at the cost of higher leakage.

While the 8T SRAM cell 300 is operating, at least a portion of the devices in the storage element 302 will be turned on and will thus be continuously subject to leakage. In one embodiment, the devices in the storage element 302 may be fabricated using the thicker functional gate oxide. This results in lower leakage in the storage element 302, thereby reducing power consumption of the 8T SRAM cell 300. Because at least a portion of the devices in the storage element 302 are in continuous operation, a reduction in leakage power as compared to other functional gate oxide thicknesses may be realized.

In one embodiment, the storage element 302 includes cross-coupled inverters, shown here as PFETs 350 and 352 of the thicker functional gate oxide coupled to NFETs 354 and 356 of the thicker functional gate oxide, coupled between a ground potential 340 and a first potential 342. This allows a single bit of information and its complement to be stored at nodes 358 and 360. Although the present embodiment is directed towards cross-coupled inverters, those skilled in the art will recognize that the teachings of the present disclosure also apply to other methods of statically storing information.

The write circuit 304 may not need to be capable of high speed operation and thus it is not as beneficial to fabricate the devices in the write circuit 304 using the thinner functional gate oxide. In one embodiment, at least a portion of the devices in write circuit 304 are fabricated using the thicker functional gate oxide. Accordingly, leakage power consumed by the write circuit 304 is reduced, thereby reducing power consumption of the 8T SRAM cell 300. However, at low supply voltages, the use of thicker functional gate oxide for at least a portion of the devices in the write circuit 304 may lead to unacceptably low write performance and degraded write stability. In order to improve the performance and stability of the write circuit 304 in such designs, a write word line 324 may be adapted to be driven by a driver circuit 380. The driver circuit 380 is coupled to a second potential 390 that is higher than the first potential 342, and is also coupled to the ground potential 340.

In one embodiment, the write circuit 304 includes NFETs 326 and 328 which are fabricated using the thicker functional gate oxide. The write circuit 304 further includes the write word line 324 adapted to control NFETs 326 and 328 such that values on complementary write bit lines 320 and 322 may be written into the nodes 358 and 360. Although in this embodiment an NFET pass-gate write circuit configuration has been described, those skilled in the art will recognize that other types of write circuits may be employed without departing from the scope of the teachings of the present disclosure.

The read circuit 306 includes NFETs 334 and 336, which are coupled to the storage element 302 in order to allow the bit of data stored in the storage element 302 to be read. The read circuit 306 further includes a read word line 332 adapted to control the NFET 334, and a read bit line 330 coupled to the NFET 334. The NFET 336 is coupled between the NFET 334 and a ground potential 340 and is controlled by the node 360. The read word line 332 and read bit line 330 may be selectively controlled to allow the logical complement of a logical value stored at the node 360 to be present on the read bit line 330. Those skilled in the art will recognize that other read circuit configurations may be employed without departing from the scope of the teachings of the present disclosure.

In one embodiment, NFETs 334 and 336 in the read circuit 306 are fabricated using the thinner functional gate oxide. This results in increased performance for read operations from the 8T SRAM cell 300, which is advantageous because read operations are commonly a limiting factor in memory performance. However, the use of the thinner functional gate oxide in the read circuit 306 may lead to increased leakage. It may be advantageous to use other techniques in order to reduce leakage in the read circuit 306. For example, a source bias may be applied to at least a portion of the read circuit to turn off devices in the read circuit 306 more effectively. Also, a footer device (not shown) may be added to the read circuit 306 to allow the remainder of the read circuit 306 to be disconnected from the ground potential 340.

In an exemplary 45 nm TGO process, the first potential is 0.9 volts and the second potential is 1.1 volts. However, other voltages may be used without departing from the teachings of the present disclosure. Additionally, both the first potential 342 and the second potential 390 may be adapted to be variable voltage supplies. For example, the first potential 342 may vary between 0.6 volts and 0.9 volts depending on a mode of operation of a device incorporating the 8T SRAM cell 300.

In the present embodiment, all of the devices in the storage element 302 and the write circuit 304 are of the thicker functional gate oxide and all of the devices in the read circuit 306 are of the thinner functional gate oxide. However, those skilled in the art will recognize that it is possible to realize some benefit in power consumption or performance even if not all of the devices in the storage element 302 and the write circuit 304 are fabricated using the thicker functional gate oxide and not all of the devices in the read circuit 306 are fabricated using the thinner functional gate oxide. For example, in applications where it is particularly advantageous to reduce power consumption during read operations, the NFET 336 of the read circuit 306 could be fabricated using the thicker functional gate oxide to reduce power since the gate of the NFET 336 is coupled directly to the storage element and thus, frequent switching of the NFET 336 may be unlikely. In such an application, the NFET 334 could be fabricated using the thinner functional gate oxide to retain some performance benefit.

Figure 4:
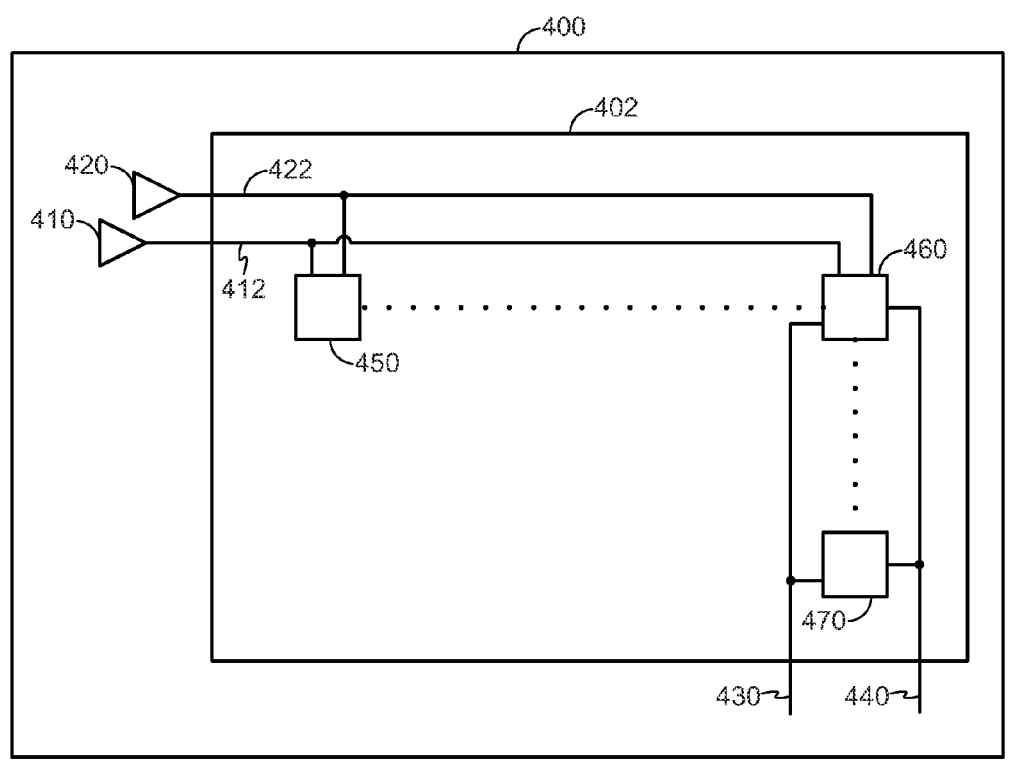
FIG. 4 is a block diagram of a memory array incorporating the teachings of the present disclosure.

FIG. 4 is a block diagram of a memory array 400 incorporating the teachings of the present disclosure. The memory array includes a memory cell array 402 with m rows and n columns of exemplary 8T SRAM cells as shown in FIG. 3 that incorporate the teachings of the present disclosure as previously described. 8T SRAM cells 450, 460 and 470 represent the (1,n), (m,n) and (m,1) cells of the array, respectively. Each row includes a write word line driver 410 coupled to a write word line 412 and a read word line driver 420 coupled to a read word line 422. Both the write word line 412 and the read word line 422 are coupled to each of the memory cells comprising the row; for example, cells 450 through 460 which represent memory cells (1,n) through (m,n). Each column includes a write bit line 430 and a read bit line 440. Both the write bit line 430 and read bit line 440 are coupled to each of the memory cells comprising the row; for example, cells 460 through 470 which represent memory cells (m,n) through (m,1).

Examples of memory array structures where the teachings of the present disclosure may be advantageously employed include but are not limited to cache memories or off-chip memories. Such cache memories or off-chip memories may be incorporated into consumer electronic devices such as cellular phones, portable digital assistants (PDAs) or laptop computers.

When the leakage of an 8T SRAM cell 300 according to the present disclosure is compared to that of an 8T SRAM cell as previously known in the art (and assuming that the individual devices in each SRAM cell have the same dimensions), a significant reduction of leakage may be achieved. In simulations, a reduction of leakage in the range of 95-98% was observed. However, the use of thicker gate oxide devices in the 8T SRAM cell 300 of the present disclosure may result in reduced performance of the cell. In order to realize both the power savings provided by the teachings of this disclosure and an acceptable level of performance in a larger memory structure, the individual devices of the 8T SRAM cell 300 can be larger than those in the SRAM cells already known in the art. Conventionally, this is not a preferred approach because as device sizes increase, the size of each individual 8T SRAM cell 300 increases and leads to increased chip area and increased power consumption. However, even after the individual devices of the 8T SRAM cell 300 have been re-sized to achieve the desired performance goals, a significant reduction of leakage power may still be realized by making use of the teachings of the present disclosure. In simulations taking re-sizing as described above into account, a reduction of leakage power in the range of 50-75% was observed.

The teachings of the present disclosure may be advantageously combined with other techniques for reducing power. For example, both the read and write bit lines may be disconnected or allowed to "float" while they are not being actively used.

Figure 5:
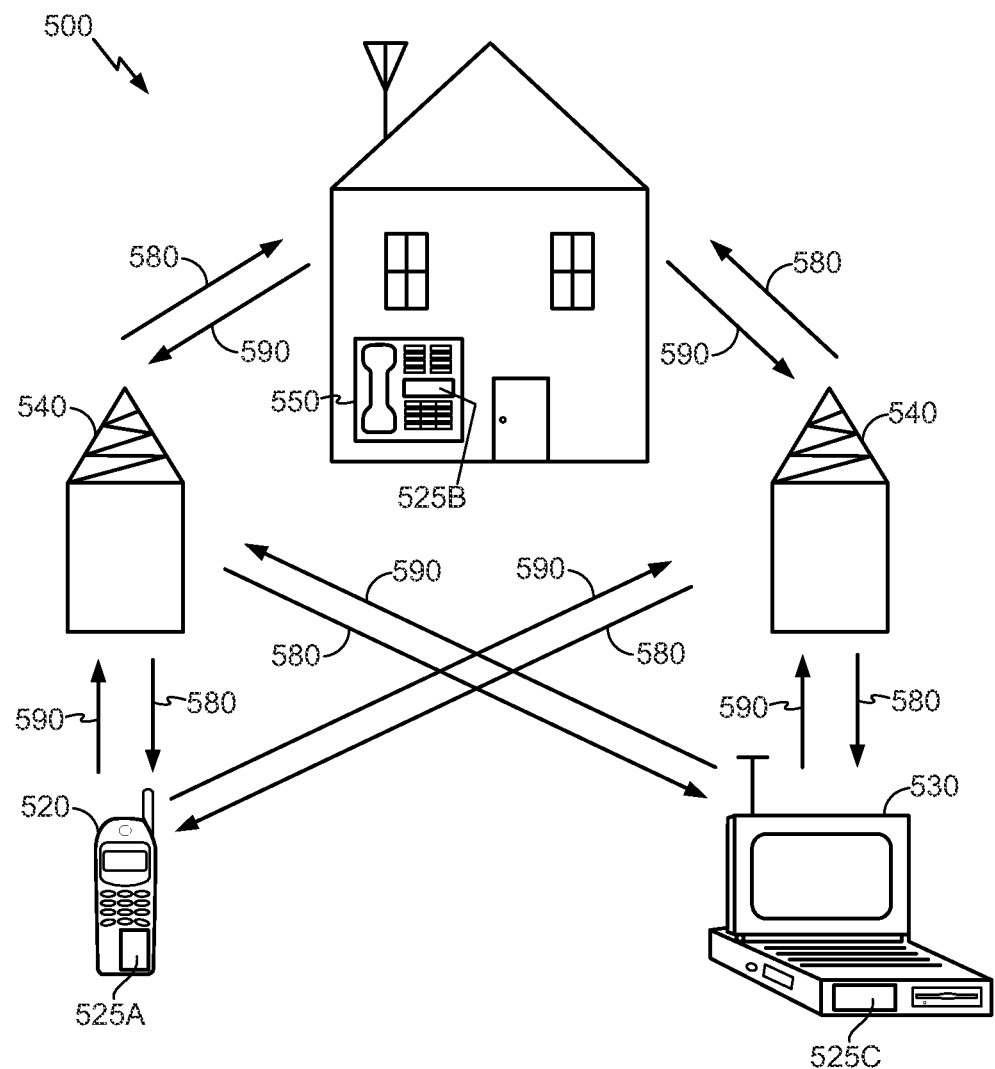
FIG. 5 is a block diagram showing an exemplary wireless communication system in which an embodiment of the disclosure may be advantageously employed.

FIG. 5 is a block diagram showing an exemplary wireless communication system 500 in which an embodiment of the disclosure may be advantageously employed. For purposes of illustration, FIG. 5 shows three remote units 520, 530, and 550 and two base stations 540. It will be recognized that typical wireless communication systems may have many more remote units and base stations. Remote units 520, 530, and 550 include IC devices 525A, 525B and 525C that include the circuitry disclosed here. It will be recognized that any device containing an IC may also include the circuitry disclosed here, including the base stations, switching devices, and network equipment. FIG. 5 shows forward link signals 580 from the base stations 540 to the remote units 520, 530, and 550 and reverse link signals 590 from the remote units 520, 530, and 550 to base stations 540.

In FIG. 5, remote unit 520 is shown as a mobile telephone, remote unit 530 is shown as a portable computer, and remote unit 550 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 5 illustrates remote units according to the teachings of the disclosure, the disclosure is not limited to these exemplary illustrated units. The disclosure may be suitably employed in any device which includes integrated circuits.

While the teachings of the present disclosure are disclosed in the context of SRAM cells, it will be recognized that a wide variety of implementations may be employed by persons of ordinary skill in the art consistent with the teachings herein and the claims which follow below.

What is claimed is:

1. A memory cell, comprising:
   a storage element;
   a write circuit coupled to the storage element; and
   a read circuit coupled to the storage element, the read circuit including a first transistor and a second transistor; wherein at least a portion of the storage element and at least a portion of the write circuit are fabricated using a first functional gate oxide having a first thickness, wherein the first transistor of the read circuit is coupled to the storage element, wherein the second transistor of the read circuit is coupled to the first transistor of the read circuit, and wherein the first transistor of the read circuit and the second transistor of the read circuit are fabricated using a second functional gate oxide having a second thickness that is less than the first thickness.

2. The memory cell of claim 1, wherein the write circuit comprises a write word line and wherein the write word line is adapted to be coupled to a second potential, and the remainder of the write circuit and the read circuit are adapted to be coupled to the first potential that differs from the second potential.

3. The memory cell of claim 2, wherein the second potential is adapted to be varied.

4. The memory cell of claim 1, wherein the first functional gate oxide provides lower leakage than the second functional gate oxide.

5. The memory cell of claim 1, wherein the second functional gate oxide provides higher performance than the first functional gate oxide.

6. The memory cell of claim 1, wherein the write circuit comprises a write bit line adapted to float when no write operation is being performed.

7. The memory cell of claim 1, wherein the read circuit comprises a read bit line.

8. The memory cell of claim 7, wherein the read bit line is adapted to float when no read operation is being performed.

9. The memory cell of claim 1, wherein a source bias is applied to at least a portion of the read circuit.

10. The memory cell of claim 1 further comprising a plurality of write circuits coupled to the storage element.

11. The memory cell of claim 1 further comprising a plurality of read circuits coupled to the storage element.

12. The memory cell of claim 1, wherein the memory cell is disposed in one of the group consisting of: a microprocessor, a digital signal processor, and a memory array.

13. A memory cell, comprising:
a storage element comprising a first n-channel field effect transistor (NFET), a second NFET, a first p-channel field effect transistor (PFET), and a second PFET, wherein the source terminal of the first NFET and the source terminal of the second NFET are coupled to a ground potential and the source terminal of the first PFET and the source terminal of the second PFET are coupled to a first potential, wherein the gate terminal of the first NFET is coupled to the gate terminal of the first PFET, wherein the gate terminal of the second NFET is coupled to the gate terminal of the second PFET, wherein the drain terminal of the first NFET is coupled to the drain terminal of the first PFET, wherein the drain terminal of the second NFET is coupled to the drain terminal of the second PFET, wherein the gate terminal of the first NFET and the gate terminal of the first PFET are coupled to the drain terminal of the second NFET and to the drain terminal of the second PFET, and wherein the gate terminal of the second NFET and the gate terminal of the second PFET are coupled to the drain terminal of the first NFET and to the drain terminal of the first PFET;
a write circuit comprising a third NFET and a fourth NFET, wherein the gate terminal of the third NFET and the gate terminal of fourth NFETs are coupled together and are adapted to be coupled to a write word line, wherein the source terminals of the third NFET and the fourth NFET are each adapted to be coupled to one of a pair of complementary bit lines, wherein the drain terminal of the third NFET is coupled to the gate terminal of the first NFET and to the gate terminal of the first PFET, and wherein the drain terminal of the fourth NFET is coupled to the gate terminal of the second NFET and to the gate terminal of the second PFET; and
a read circuit comprising a fifth NFET and a sixth NFET, wherein the source terminal of the fifth NFET is coupled to the ground potential, wherein the gate terminal of the fifth NFET is coupled to the drain terminal of the first NFET and to the drain terminal of the first PFET, wherein the drain terminal of the fifth NFET is coupled to the source terminal of the sixth NFET, wherein the gate terminal of the sixth NFET is adapted to be coupled to a read word line, wherein the first PFET of the storage element, the second PFET of the storage element, the first NFET of the storage element, and the second NFET of the of the storage element are fabricated using a first functional gate oxide having a first thickness, and wherein the fifth NFET of the read circuit and the sixth NFET of the read circuit are fabricated using a second functional gate oxide having a second thickness that is less than the first thickness.

14. A memory cell, comprising:
means for storing data;
means for writing data into the means for storing data, the means for writing data coupled to the means for storing data; and
means for reading data from the means for storing data, wherein the means for reading data includes a first transistor and a second transistor;
wherein at least a portion of the means for storing data and at least a portion of the means for writing data are fabricated using a first functional gate oxide having a first thickness, wherein the first transistor of the means for reading data is coupled to the means for storing data, wherein the second transistor of the means for reading data is coupled to the first transistor of the means for reading data, and wherein the first transistor of the means for reading data and the second transistor of the means for reading data are fabricated using a second functional gate oxide having a second thickness that is less than the first thickness.

15. A memory array comprising a plurality of memory cells, wherein at least one memory cell comprises:
a storage element;
a write circuit coupled to the storage element; and
a read circuit coupled to the storage element, the read circuit including a first transistor and a second transistor;
wherein at least a portion of the storage element and at least a portion of the write circuit are fabricated using a first functional gate oxide having a first thickness, wherein the first transistor of the read circuit is coupled to the storage element, wherein the second transistor of the read circuit is coupled to the first transistor of the read circuit, and wherein the first transistor of the read circuit and the second transistor of the read circuit are fabricated using a second functional gate oxide having a second thickness that is less than the first thickness.

16. The memory array of claim 15 wherein the write circuit further comprises a write word line, wherein the write word line is adapted to be coupled to a second potential, and wherein the remainder of the write circuit and the read circuit are adapted to be coupled to the first potential.

17. The memory array of claim 15, wherein the memory array is disposed in one of the group consisting of: a microprocessor, a digital signal processor, and a memory.

18. The memory cell of claim 1, wherein the read circuit comprises a read bit line adapted to float when no read operation is being performed.

19. The memory cell of claim 14, wherein the means for reading data comprises a read bit line that is adapted to float when no read operation is being performed.

20. The memory array of claim 15, wherein the at least one memory cell comprises a read bit line adapted to float when no read operation is being performed.

21. A non-transitory computer-readable medium including program code that, when executed by a processor, causes the processor to:
write to a storage element using a write circuit coupled to the storage element; and
read from the storage element using a read circuit coupled to the storage element, the read circuit including a first transistor and a second transistor;
wherein at least a portion of the storage element and at least a portion of the write circuit are fabricated using a first functional gate oxide having a first thickness, wherein the first transistor of the read circuit is coupled to the storage element, wherein the second transistor of the read circuit is coupled to the first transistor of the read circuit, and wherein the first transistor of the read circuit and the second transistor of the read circuit are fabricated using a second functional gate oxide having a second thickness that is less than the first thickness.

* * * * *